(12) United States Patent  
Yukawa et al.

(10) Patent No.: US 11,927,613 B2  
(45) Date of Patent: Mar. 12, 2024

(54) SHEET ELECTRICAL RESISTANCE MEASURING DEVICE

(71) Applicant: FUJIFILM Business Innovation Corp., Tokyo (JP)

(72) Inventors: Kouhei Yukawa, Kanagawa (JP); Kenta Ogata, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 2 days.

(21) Appl. No.: 17/409,750

(22) Filed: Aug. 23, 2021

(65) Prior Publication Data

US 2022/0373582 A1 Nov. 24, 2022

(30) Foreign Application Priority Data

May 21, 2021 (JP) .................. 2021-086307

(51) Int. Cl.  
*G01R 27/14* (2006.01)
(52) U.S. Cl.  
CPC .................... *G01R 27/14* (2013.01)
(58) Field of Classification Search  
CPC ........ G01R 27/00; G01R 27/08; G01R 27/14; G03G 2215/00; G03G 2215/00763; G03G 15/00  
See application file for complete search history.

(56) References Cited

U.S. PATENT DOCUMENTS

| | | | |
|---|---|---|---|
| 5,608,506 A | 3/1997 | Omoto | |
| 6,029,022 A | 2/2000 | Takase | |
| 6,804,478 B2 | 10/2004 | Martin et al. | |
| 8,351,810 B2 | 1/2013 | Choi | |
| 2014/0186059 A1* | 7/2014 | Suzuki | ................ B65H 85/00 271/265.01 |
| 2015/0260805 A1* | 9/2015 | Miura | ............. G01R 33/1253 324/228 |

(Continued)

FOREIGN PATENT DOCUMENTS

| | | | | |
|---|---|---|---|---|
| GB | 2331585 A | * | 5/1999 | ........... G01N 27/121 |
| JP | S5772456 | | 5/1982 | |

(Continued)

OTHER PUBLICATIONS

"Search Report of Europe Counterpart Application", dated Feb. 17, 2022, pp. 1-9.

(Continued)

*Primary Examiner* — Son T Le  
(74) *Attorney, Agent, or Firm* — JCIPRNET

(57) ABSTRACT

A sheet electrical resistance measuring device includes: a housing having a gap for receiving a sheet therein; a sheet pulling member comprising a first and second rotating rollers that are disposed in the housing and pulls the sheet inserted into the gap; a stopper that is disposed in the housing and causes the sheet pulling member to stop pulling the sheet; and a pair of electrodes that is disposed in the housing and measures electrical resistance of the sheet which is stopped and brought into contact with the pair of electrodes. The sheet electrical resistance measuring is capable of reducing the likelihood of wrinkles to be occurred when inserting the sheet, thereby increasing measurement accuracy of the sheet electrical resistance measuring device.

20 Claims, 8 Drawing Sheets

(56) References Cited

U.S. PATENT DOCUMENTS

2021/0011065 A1  1/2021  Morimitsu

FOREIGN PATENT DOCUMENTS

| | | |
|---|---|---|
| JP | H04362676 | 12/1992 |
| JP | 2001356639 | 12/2001 |
| JP | 3603816 | 12/2004 |
| JP | 2005249758 | 9/2005 |
| JP | 2006089210 | 4/2006 |
| JP | 3980393 | 9/2007 |
| JP | 2011137774 | 7/2011 |
| KR | 101282983 | 7/2013 |

OTHER PUBLICATIONS

"Office Action of Europe Counterpart Application", dated May 24, 2023, p. 1-p. 4.
"Office Action of Europe Counterpart Application", dated Dec. 20, 2023, p. 1-p. 4.

* cited by examiner

SHEET ELECTRICAL RESISTANCE MEASURING DEVICE

CROSS-REFERENCE TO RELATED APPLICATIONS

This application is based on and claims priority under 35 USC 119 from Japanese Patent Application No. 2021-086307 filed May 21, 2021.

BACKGROUND

(i) Technical Field

The present disclosure relates to a sheet electrical resistance measuring device.

(ii) Related Art

Japanese Unexamined Patent Application Publication No. 2011-137774 discloses a measurement terminal and a measurement lead using the measurement terminal. The measurement terminal is used when the electrical resistance of a thin-film sheet is measured using four-terminal sensing. In this related art, the positions of four measurement terminals are fixed so that the value obtained by dividing the measured voltage value by the current value becomes equal to the resistance value of a thin-film sheet.

SUMMARY

In some sheet electrical resistance measuring devices, the position of a sheet to be measured is determined by inserting the sheet into a gap of a measuring device and by abutting the sheet against the rear side of the measuring device. In this configuration, if the sheet is inserted excessively, a wrinkle or a fold, for example, may occur in the sheet, which may lower the measurement accuracy of the electrical resistance of the sheet.

Aspects of non-limiting embodiments of the present disclosure relate to a sheet electrical resistance measuring device that is able to reduce the occurrence of wrinkles in a sheet compared with the configuration in which a sheet is brought into contact with electrodes when it is inserted into a gap of a housing of a measuring device.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a sheet electrical resistance measuring device including: a housing having a gap for receiving a sheet therein; a sheet pulling member that is disposed in the housing and pulls the sheet inserted into the gap; a stopper that is disposed in the housing and causes the sheet pulling member to stop pulling the sheet; and a pair of electrodes that is disposed in the housing and measures electrical resistance of the sheet which is stopped and brought into contact with the pair of electrodes.

BRIEF DESCRIPTION OF THE DRAWINGS

Exemplary embodiments of the present disclosure will be described in detail based on the following figures, wherein.

DETAILED DESCRIPTION

First Exemplary Embodiment

A sheet electrical resistance measuring device 10 according to a first exemplary embodiment will be described below.

[Structure]

The structure of the sheet electrical resistance measuring device 10 will first be explained below with reference to FIGS. 1 through 4.

Figure 1:
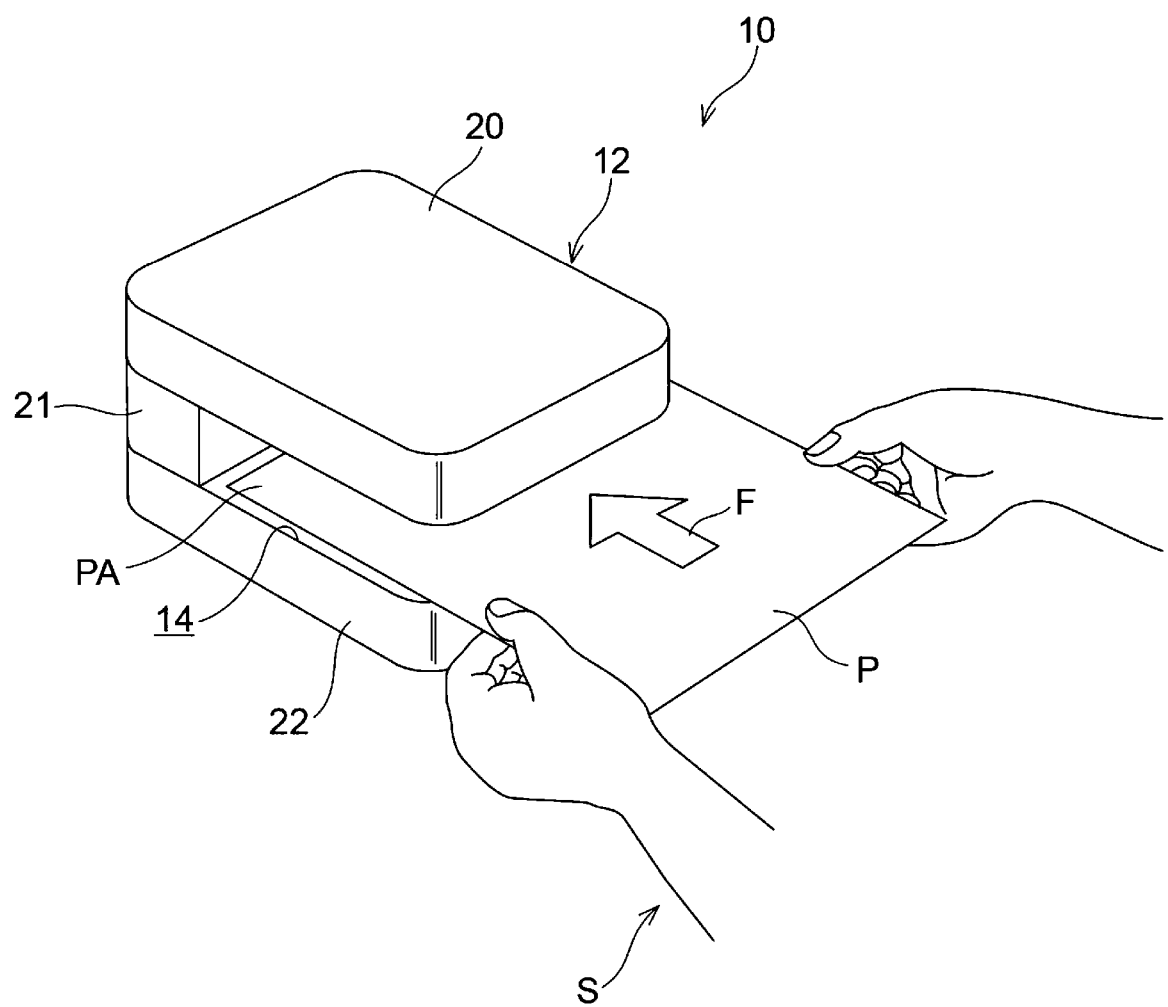
FIG. 1 is a perspective view of a sheet electrical resistance measuring device according to an exemplary embodiment.
Figure 2A:
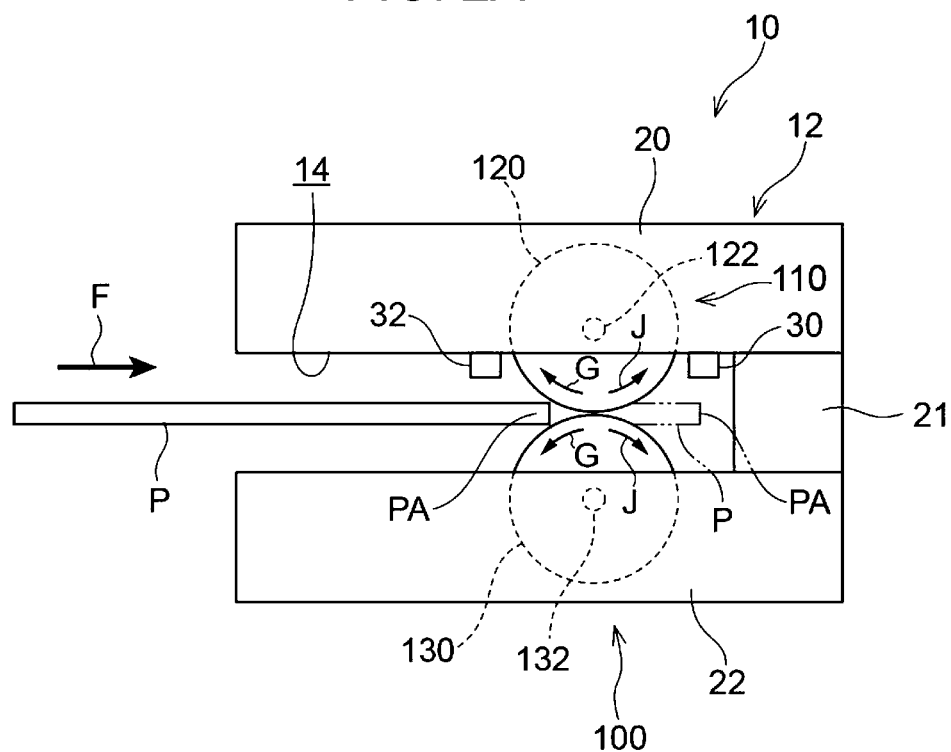
FIG. 2A is a side view of a sheet electrical resistance measuring device according to a first exemplary embodiment, as viewed from the direction of a rotating shaft of a rotating roller.

The sheet electrical resistance measuring device 10 is a device that measures the electrical resistance of a sheet P, such as paper. As shown in FIGS. 1 and 2A, the sheet electrical resistance measuring device 10 includes a housing 12 having a gap 14 for receiving the sheet P. The housing 12 includes a first housing 20, a second housing 22, and a joint section 21 which connects the end portions of the first and second housings 20 and 22. The gap 14 is formed between the first and second housings 20 and 22.

The inserting direction of the sheet P into the gap 14 and the pulling direction of a sheet pulling member 100, which will be discussed later, are indicated by the arrow F in FIGS. 1 and 2A. The upstream side of the pulling direction F in the housing 12 is the near (front) side, while the downstream side of the pulling direction F is the far (rear) side.

Figure 2B:
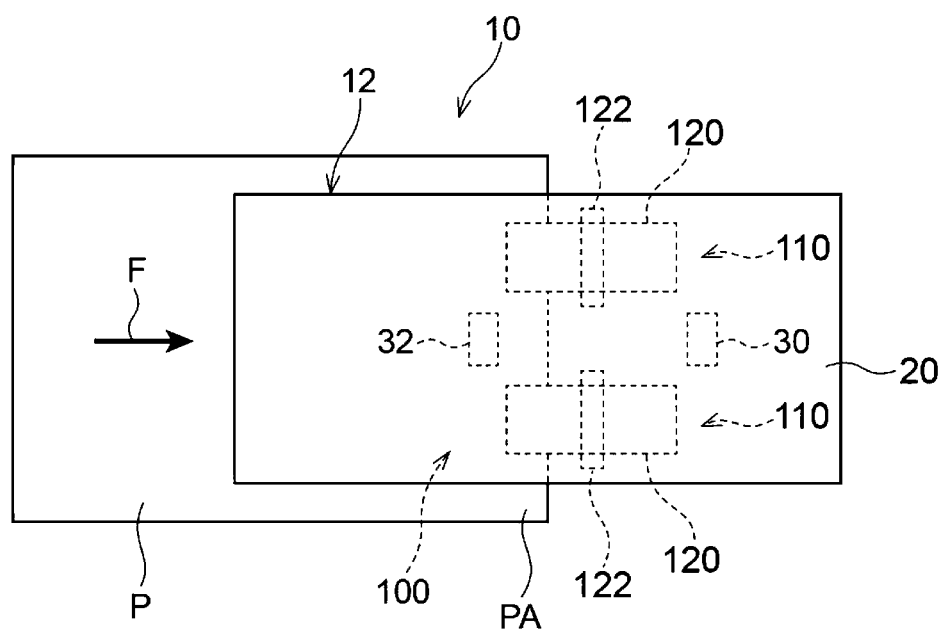
FIG. 2B is a plan view of the sheet electrical resistance measuring device according to the first exemplary embodiment.

As shown in FIGS. 2A and 2B, the sheet pulling member 100, which pulls the sheet P inserted into the gap 14 to the far (rear) side, is provided in the housing 12. The sheet pulling member 100 includes a pair of rotating rollers 110

(which will be called the rotating roller pair 110) that sandwiches both surfaces of the sheet P. The rotating roller pair 110 is constituted by first and second rotating rollers 120 and 130, as shown in FIG. 2A. The first rotating roller 120 is disposed in the first housing 20, while the second rotating roller 130 is disposed in the second housing 22.

The first rotating roller 120 is a conductive roller, while the second rotating roller 130 is an insulating roller. A rotating shaft 122 of the first rotating roller 120 is a conductive shaft, while a rotating shaft 132 of the second rotating roller 130 may be a conductive or insulating shaft.

As shown in FIG. 2B, two rotating roller pairs 110 are provided to be spaced apart in the direction of the rotating shafts 122 and 132.

Each of the rotating roller pairs 110 shown in FIGS. 2A and 2B, that is, the first and second rotating rollers 120 and 130, are rotated by a rotation drive mechanism 150 (see FIG. 3) including a motor, a gear, and other elements, which are not shown.

The rotation drive mechanism 150 is able to rotate the first and second rotating rollers 120 and 130 both in the forward direction indicated by the arrow J and in the reverse direction indicated by the arrow G in FIG. 2A.

The sheet electrical resistance measuring device 10 includes a stop detection sensor 30 and a start detection sensor 32 that detect the leading end PA of the sheet P. The stop detection sensor 30 is disposed to detect the leading end PA of the sheet P in the gap 14 at the back of the sheet pulling member 100. The start detection sensor 32 is disposed to detect the leading end PA of the sheet P in the gap 14 at the front of the sheet pulling member 100.

Figure 3:
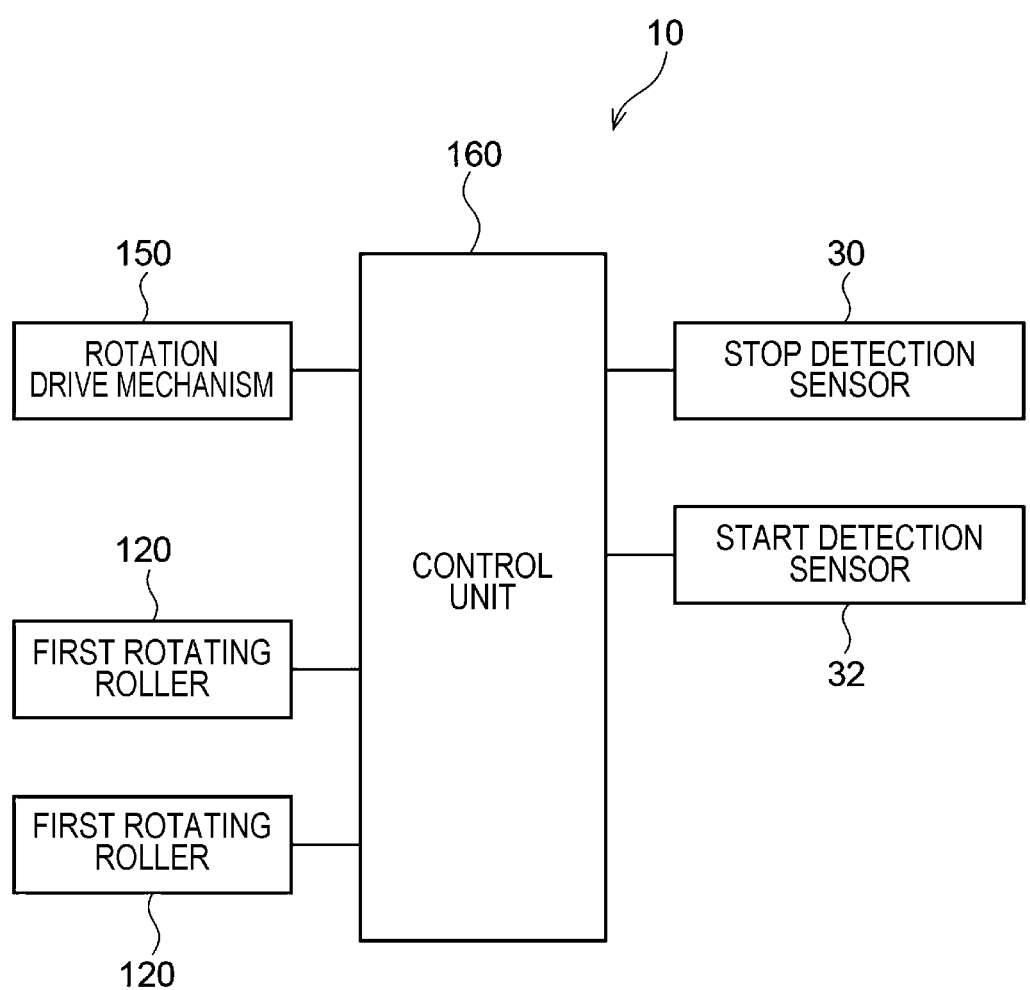
FIG. 3 is a block diagram illustrating an example of the hardware configuration of the sheet electrical resistance measuring device according to the first exemplary embodiment.

As shown in FIG. 3, the sheet electrical resistance measuring device 10 includes a control unit 160. The above-described rotation drive mechanism 150, stop detection sensor 30, and start detection sensor 32 are electrically connected to the control unit 160. The two first rotating rollers 120 are electrically connected to the control unit 160 via the rotating shafts 122 (see FIGS. 2A and 2B).

As the hardware configuration, the control unit 160 is constituted by a computer including a central processing unit (CPU), a read only memory (ROM), a random access memory (RAM), a hard disk drive (HDD), and a network interface, none of which are shown. The ROM stores a program for implementing processing routines, for example. The RAM temporarily stores data.

Figure 4:
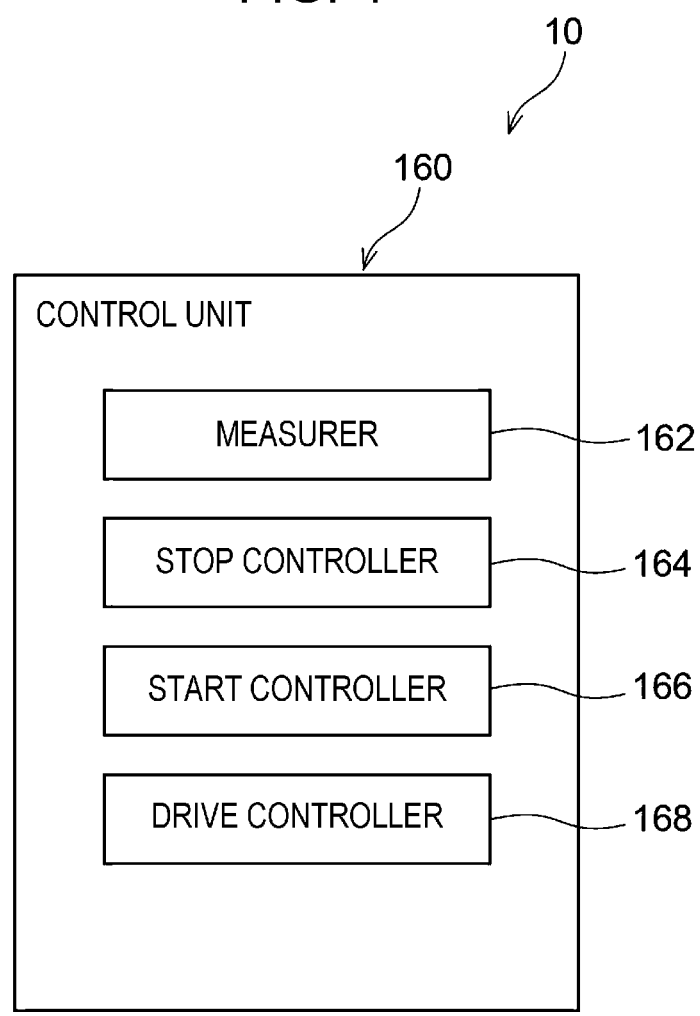
FIG. 4 is a block diagram illustrating an example of the functional configuration of a control unit of the sheet electrical resistance measuring device according to the first exemplary embodiment.

FIG. 4 illustrates an example of the functional configuration of the control unit 160. The control unit 160 includes a measurer 162, a stop controller 164, a start controller 166, and a drive controller 168. The measurer 162 measures the electrical resistance between the two first rotating rollers 120 contacting the sheet P. The stop controller 164 instructs the drive controller 168 to stop driving the rotation drive mechanism 150 in response to input of a detection signal from the stop detection sensor 30. The start controller 166 instructs the drive controller 168 to start driving the rotation drive mechanism 150 in response to input of a detection signal from the start detection sensor 32. The drive controller 168 controls the rotation drive mechanism 150.

[Measuring Method for Electrical Resistance of Sheet]

A measuring method for the electrical resistance of the sheet P will now be discussed below.

As shown in FIG. 1, a user S inserts the sheet P into the gap 14 of the housing 12 of the sheet electrical resistance measuring device 10 from the near (front) side to the far (rear) side.

As shown in FIG. 2A, in response to the start detection sensor 32 detecting the leading end PA of the sheet P inserted in the gap 14 at a position before the sheet pulling member 100, the control unit 160 causes the rotation drive mechanism 150 to start rotating the first and second rotating rollers 120 and 130 in the forward direction indicated by the arrow J, thereby pulling the sheet P into the far side of the housing 12.

After the sheet P is fed to a position at the back of the sheet pulling member 100 and the leading end PA of the sheet P passing through the sheet pulling member 100 is detected by the stop detection sensor 30, the control unit 160 causes the rotation drive mechanism 150 to stop rotating the first and second rotating rollers 120 and 130. The position of the sheet P in this state is indicated by the imaginary lines (long dashed double-dotted lines) in FIG. 2A.

When the sheet P is stopped, the control unit 160 measures the electrical resistance of the sheet P contacting the two first rotating rollers 120 and disposed therebetween (see FIG. 2B). In the first exemplary embodiment, the control unit 160 measures the surface resistance of the sheet P between the two first rotating rollers 120. The measured electrical resistance of the sheet P is displayed on a display, which is not shown.

In the first exemplary embodiment, after the measurement result is displayed on the display, and then, after the lapse of a setting time, the control unit 160 causes the first and second rotating rollers 120 and 130 to rotate in the reverse direction indicated by the arrow G so as to feed back the sheet P toward the near (front) side.

[Operation]

The operation of the sheet electrical resistance measuring device 10 according to the first exemplary embodiment will be discussed below.

When the sheet P is inserted into the gap 14, the rotating roller pairs 110 of the sheet pulling member 100 start rotating to pull the sheet P into the far side, and when the stop detection sensor 30 detects the leading end PA of the sheet P, the sheet pulling member 100 automatically stops pulling the sheet P. When the sheet P is stopped, the two first rotating rollers 120, which serve as electrodes, measure the electrical resistance of the sheet P.

The sheet P is thus less likely to wrinkle compared with the configuration in which the sheet P is brought into contact with electrodes when it is inserted into the gap 14 of the housing 12.

If the stop detection sensor 30 detects a portion of the sheet P other than the leading end PA, such as the trailing end, the sheet P would be pulled farther into the rear side. In the first exemplary embodiment, the stop detection sensor 30 detects the leading end PA of the sheet P, thereby decreasing the pulling amount of the sheet P.

In one example, the stop detection sensor 30 detects the leading end PA of the sheet P at a position before the sheet pulling member 100, and then, after the lapse of a preset time, the rotating roller pairs 110 stop rotating. Unlike this configuration, in the first exemplary embodiment, the stop detection sensor 30 detects the leading end PA of the sheet P at the back of the sheet pulling member 100, thereby making it less likely to vary the stop positions of the sheet P.

In the sheet electrical resistance measuring device 10 of the first exemplary embodiment, when the start detection sensor 32 has detected the leading end PA of the sheet P inserted in the gap 14 at a position before the sheet pulling member 100, the rotating roller pairs 110 of the sheet pulling member 100 start rotating to pull the sheet P into the far side.

If a user manually starts the sheet pulling member 100 pulling the sheet P into the far side, the sheet P may be wrinkled if it is excessively inserted and strikes against the rotating roller pairs 110. Compared with this configuration, the sheet P is less likely to wrinkle in the first exemplary embodiment.

In the sheet electrical resistance measuring device 10 of the first exemplary embodiment, the first and second rotating rollers 120 and 130 of the rotating roller pairs 110 pull the sheet P by sandwiching both surfaces of the sheet P.

The sheet P is thus less likely to wrinkle compared with the configuration in which a rotator pulls the sheet P by contacting only one surface of the sheet P.

Since the occurrence of wrinkles in the sheet P is reduced in this manner, the measurement accuracy of the electrical resistance of the sheet P is less likely to be lowered.

In the first exemplary embodiment, the two first rotating rollers 120 serve as a function of pulling the sheet P and also as electrodes to measure the electrical resistance of the sheet P. Accordingly, no electrode dedicated to measuring the electrical resistance is required. The sheet electrical resistance measuring device 10 of the first exemplary embodiment thus requires fewer components.

Additionally, compared with the use of a rotator other than the rotating roller pairs 110, such as a rotating belt stretched on multiple rollers, fewer components are required.

Second Exemplary Embodiment

A sheet electrical resistance measuring device 11 according to a second exemplary embodiment will be described below. The same element as that of the first exemplary embodiment is designated by like reference numeral and an explanation thereof will be omitted or only simply mentioned.

[Structure]

The structure of the sheet electrical resistance measuring device 11 will first be explained below with reference to FIGS. 5A and 5B.

In terms of the structure, the sheet electrical resistance measuring device 11 is different from the sheet electrical resistance measuring device 10 of the first exemplary embodiment in that the stop detection sensor 30 (see FIG. 2A) is not provided. The stop controller 164 of the control unit 160 in the second exemplary embodiment detects a drive load of the rotation drive mechanism 150, and when the drive load exceeds a preset value, the stop controller 164 instructs the drive controller 168 to stop driving the rotation drive mechanism 150.

Figure 5A:
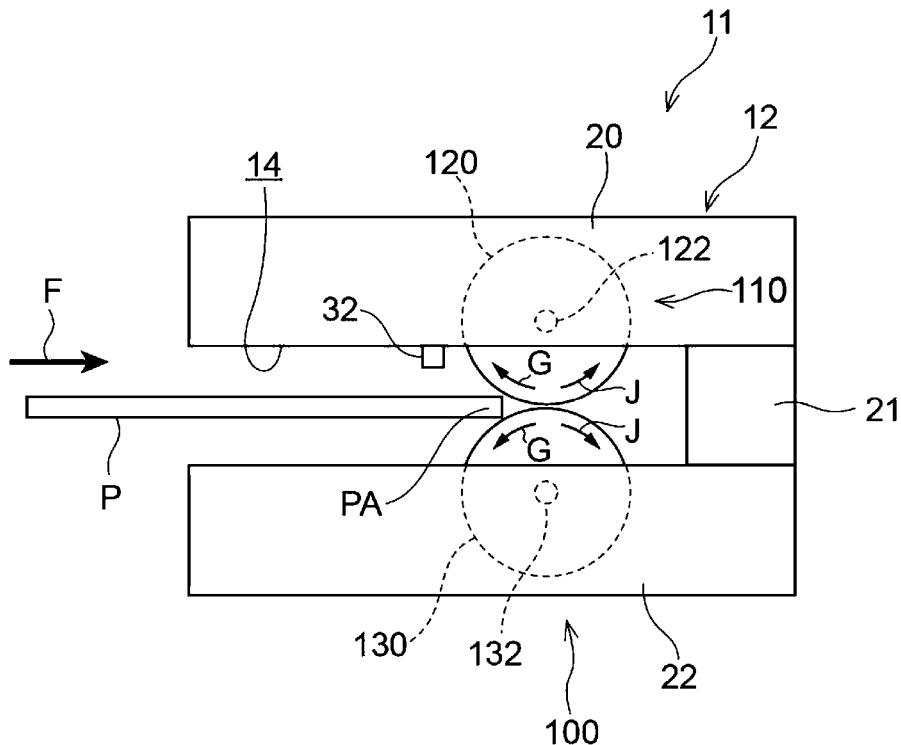
FIGS. 5A and 5B are side views of a sheet electrical resistance measuring device according to a second exemplary embodiment, as viewed from the direction of a rotating shaft of a rotating roller.

FIG. 5A schematically illustrates a state in which a thin sheet P is stopped as a result of the drive load of the rotation drive mechanism 150 exceeding the preset value. FIG. 5B schematically illustrates a state in which a thick sheet P is stopped as a result of the drive load of the rotation drive mechanism 150 exceeding the preset value. For the sake of easy representation, in FIGS. 5A and 5B, the sheet P is shown at a position before it is inserted between the first and second rotating rollers 120 and 130 of the rotating roller pairs 110. In actuality, however, the sheet P is stopped after it is inserted between the first and second rotating rollers 120 and 130 as a result of the second rotating roller 130, which is made of rubber, being elastically deformed.

[Measuring Method for Electrical Resistance of Sheet]

A measuring method for the electrical resistance of the sheet P will now be discussed below.

As shown in FIG. 1, the user S inserts the sheet P into the gap 14 of the housing 12 of the sheet electrical resistance measuring device 11 from the near (front) side to the far (rear) side.

Figure 5B:
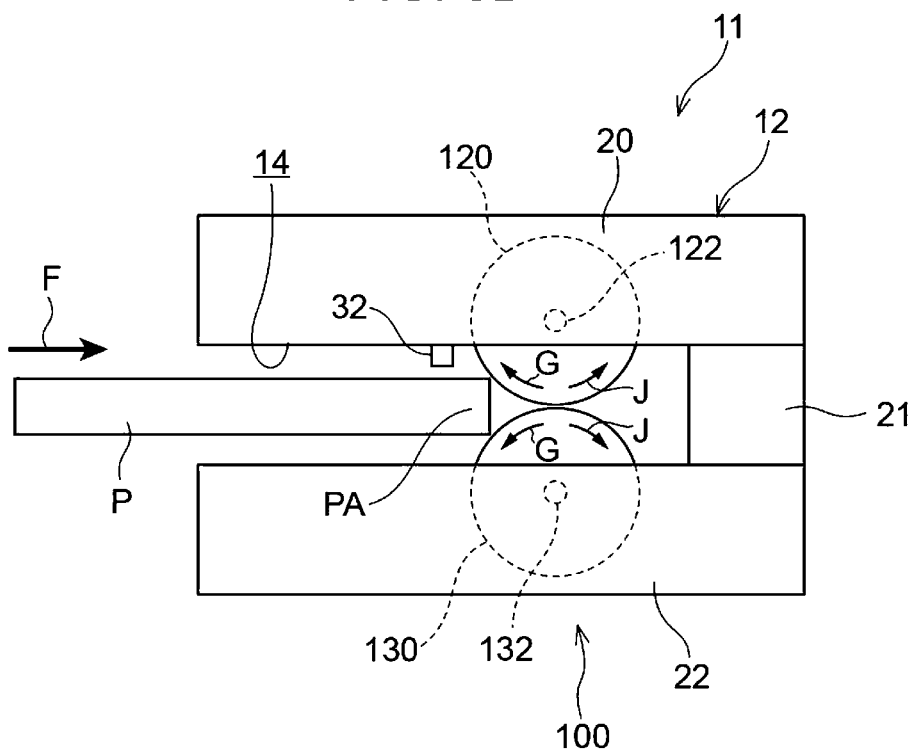

As shown in FIG. 5A or 5B, in response to the start detection sensor 32 detecting the leading end PA of the sheet P inserted in the gap 14 at a position before the sheet pulling member 100, the control unit 160 causes the rotation drive mechanism 150 (see FIG. 3) to start rotating the first and second rotating rollers 120 and 130 of the two rotating roller pairs 110 in the forward direction indicated by the arrow J. As a result, the sheet P is pulled into the far (rear) side.

When the sheet P is fed to a position at the back of the sheet pulling member 100 and the drive load of the rotation drive mechanism 150 exceeds the preset value, the control unit 160 causes the rotation drive mechanism 150 to stop rotating the first and second rotating rollers 120 and 130 of the two rotating roller pairs 110.

When the sheet P is stopped, the control unit 160 measures the electrical resistance of the sheet P contacting the two first rotating rollers 120 and disposed therebetween (see FIG. 2B). The measured electrical resistance of the sheet P is displayed on a display, which is not shown.

In the second exemplary embodiment, as well as in the first exemplary embodiment, after the measurement result is displayed on the display, and then, after the lapse of a setting time, the control unit 160 causes the first and second rotating rollers 120 and 130 to rotate in the reverse direction indicated by the arrow G so as to feed back the sheet P toward the near (front) side.

[Operation]

The operation of the sheet electrical resistance measuring device 11 according to the second exemplary embodiment will be discussed below.

When the sheet P is inserted into the gap 14, the rotating roller pairs 110 of the sheet pulling member 100 start rotating to pull the sheet P into the far side, and when the drive load of the rotation drive mechanism 150 exceeds the preset value, the sheet pulling member 100 automatically stops pulling the sheet P. When the sheet P is stopped, the two first rotating rollers 120, which serve as electrodes, measure the electrical resistance of the sheet P.

The sheet P is thus less likely to wrinkle compared with the configuration in which the sheet P is brought into contact with electrodes when it is inserted into the gap 14 of the housing 12.

In the sheet electrical resistance measuring device 11 of the second exemplary embodiment, when the start detection sensor 32 has detected the leading end PA of the sheet P inserted in the gap 14 at a position before the sheet pulling member 100, the rotating roller pairs 110 of the sheet pulling member 100 start rotating to pull the sheet P into the far side.

The sheet P is thus less likely to wrinkle compared with the configuration in which a user manually starts the sheet pulling member 100 pulling the sheet P into the far side.

In the sheet electrical resistance measuring device 11 of the second exemplary embodiment, the first and second rotating rollers 120 and 130 of the rotating roller pairs 110 pull the sheet P by sandwiching both surfaces of the sheet P.

The sheet P is thus less likely to wrinkle compared with the configuration in which a rotator pulls the sheet P by contacting only one surface of the sheet P.

Since the occurrence of wrinkles in the sheet P is reduced in this manner, the measurement accuracy of the electrical resistance of the sheet P is less likely to be lowered.

In the second exemplary embodiment, the two first rotating rollers 120 serve as a function of pulling the sheet P and also as electrodes to measure the electrical resistance of the sheet P. Accordingly, no electrode dedicated to measuring the electrical resistance is required. The sheet electrical resistance measuring device 11 of the second exemplary embodiment thus requires fewer components.

Additionally, compared with the use of a rotator other than the rotating roller pairs 110, such as a rotating belt stretched on multiple rollers, fewer components are required.

Third Exemplary Embodiment

A sheet electrical resistance measuring device 13 according to a third exemplary embodiment will be described below. The same element as that of the first or second exemplary embodiment is designated by like reference numeral and an explanation thereof will be omitted or only simply mentioned.

[Structure]

The structure of the sheet electrical resistance measuring device 13 will first be explained below with reference to FIGS. 6A through 8.

Figure 6A:
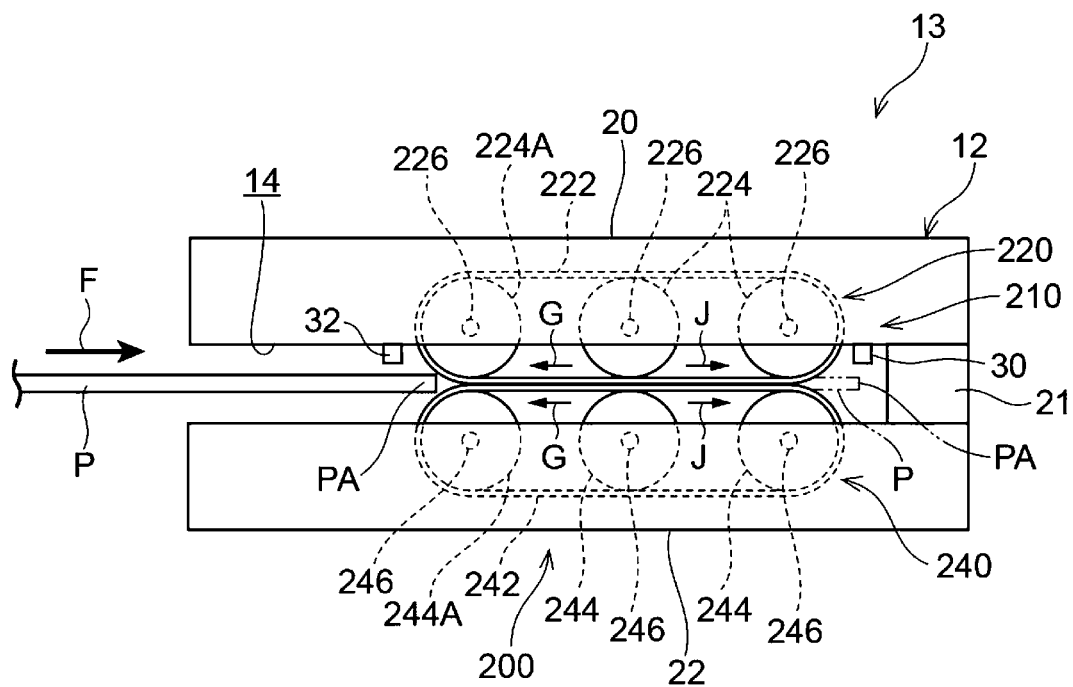
FIG. 6A is a side view of a sheet electrical resistance measuring device according to a third exemplary embodiment, as viewed from the direction of a rotating shaft of a rotating roller.

The sheet electrical resistance measuring device 13 is a device that measures the electrical resistance of a sheet P, such as paper. As shown in FIG. 6A, the sheet electrical resistance measuring device 13 includes a housing 12 having a gap 14 for receiving the sheet P. The housing 12 includes a first housing 20, a second housing 22, and a joint section 21 which connects the end portions of the first and second housings 20 and 22.

Figure 6B:
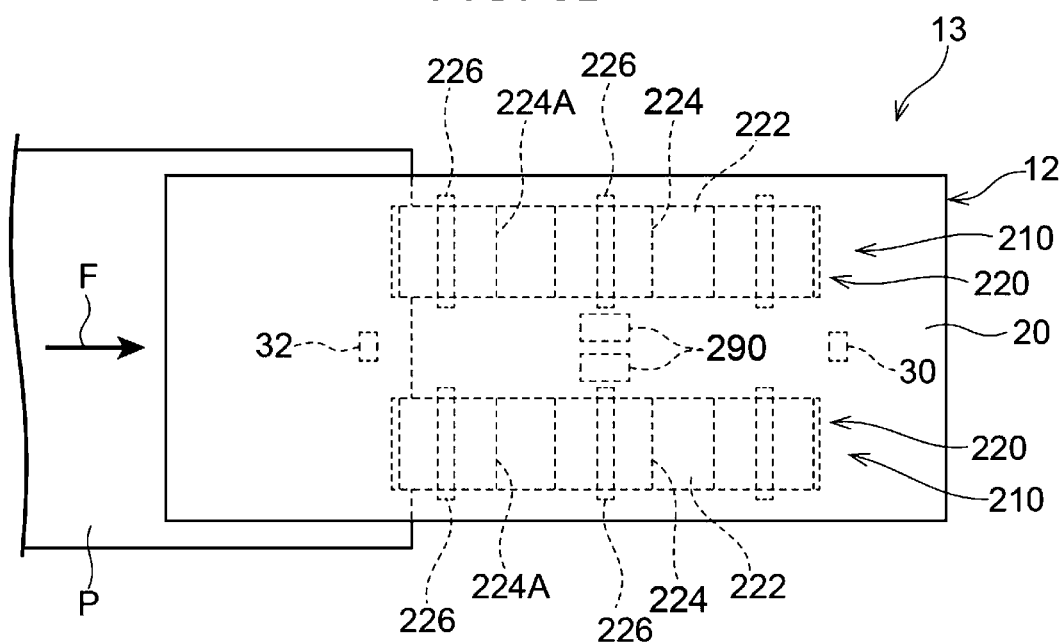
FIG. 6B is a plan view of the sheet electrical resistance measuring device according to the third exemplary embodiment.

As shown in FIGS. 6A and 6B, a sheet pulling member 200, which pulls the sheet P inserted into the gap 14 to the far (rear) side, is provided in the housing 12. The sheet pulling member 200 includes a pair of rotating belts 210 (which will be called the rotating belt pair 210) that sandwiches both surfaces of the sheet P. The rotating belt pair 210 is constituted by first and second belt units 220 and 240, as shown in FIG. 6A. The first belt unit 220 is disposed in the first housing 20, while the second belt unit 240 is disposed in the second housing 22.

The first belt unit 220 includes an insulating, endless first rotating belt 222 and plural rollers 224 on which the first rotating belt 222 is wound and stretched. Likewise, the second belt unit 240 includes an insulating, endless second rotating belt 242 and plural rollers 244 on which the second rotating belt 242 is wound and stretched.

Figure 7:
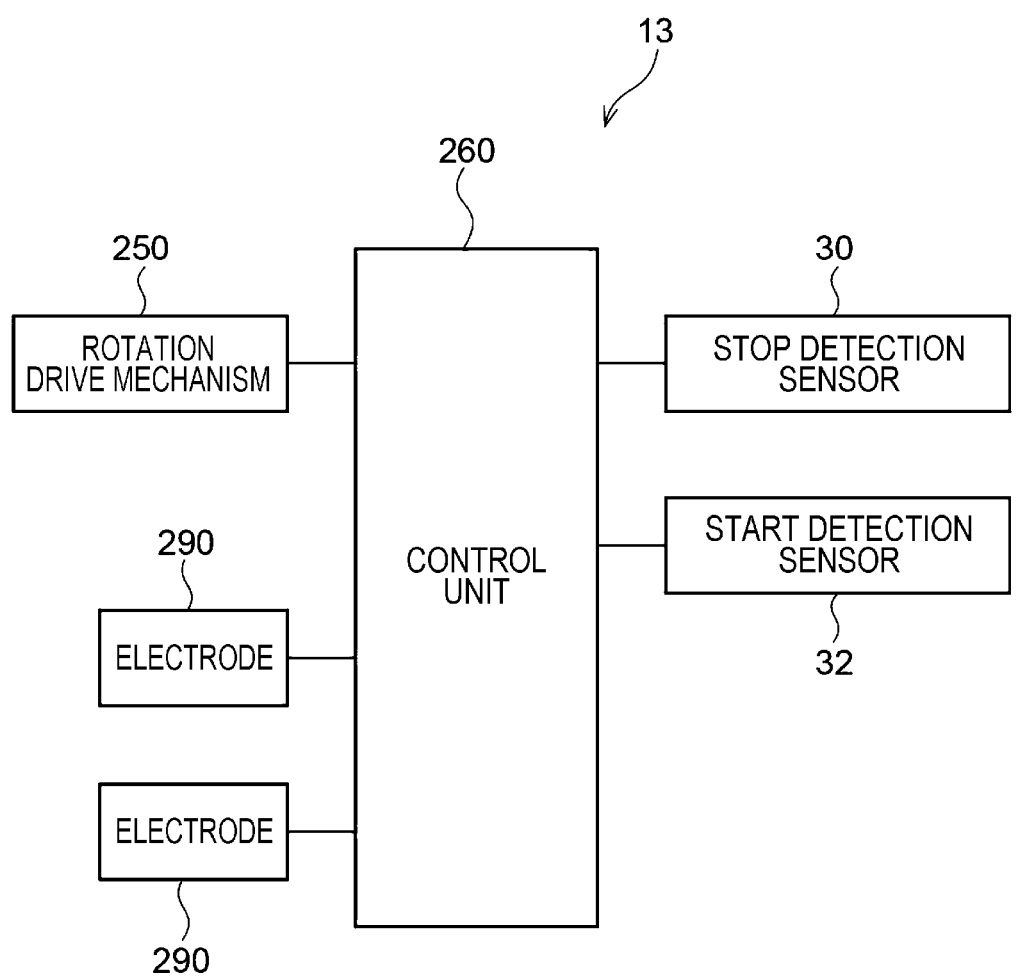
FIG. 7 is a block diagram illustrating an example of the hardware configuration of the sheet electrical resistance measuring device according to the third exemplary embodiment.

Among the rollers 224 of the first belt unit 220 and the rollers 244 of the second belt unit 240, rollers 224A and 244A disposed at the leftmost side of FIG. 6A and opposing each other are rotated by a rotation drive mechanism 250 (see FIG. 7). The rotation drive mechanism 250 includes a motor, a gear, and other elements, which are not shown. The rollers 224 each rotate around a rotating shaft 226, while the rollers 244 each rotate around a rotating shaft 246.

The rotation drive mechanism 250 is able to rotate the first and second rotating belts 222 and 242 both in the forward direction indicated by the arrow J and in the reverse direction indicated by the arrow G in FIG. 6A.

As shown in FIG. 6B, two rotating belt pairs 210 are provided to be spaced apart in the direction of the rotating shafts 226 and 246. Two electrodes 290 are provided between the two rotating belt pairs 210 while being spaced apart in the direction of the rotating shafts 226 and 246. The two electrodes 290 are disposed to contact the sheet P pulled into the far side while being sandwiched between the rotating belt pairs 210.

As shown in FIGS. 6A and 6B, the sheet electrical resistance measuring device 13 includes a stop detection sensor 30 and a start detection sensor 32 that detect the leading end PA of the sheet P. The stop detection sensor 30 is disposed to detect the leading end PA of the sheet P in the gap 14 at the back of the sheet pulling member 200. The start detection sensor 32 is disposed to detect the leading end PA of the sheet P in the gap 14 at the front of the sheet pulling member 200.

As shown in FIG. 7, the sheet electrical resistance measuring device 13 includes a control unit 260. The above-described rotation drive mechanism 250, stop detection sensor 30, and start detection sensor 32 are electrically connected to the control unit 260. The two electrodes 290 are also electrically connected to the control unit 260.

As the hardware configuration, the control unit 260 is constituted by a computer including a CPU, a ROM, a RAM, an HDD, and a network interface, none of which are shown. The ROM stores a program for implementing processing routines, for example. The RAM temporarily stores data.

Figure 8:
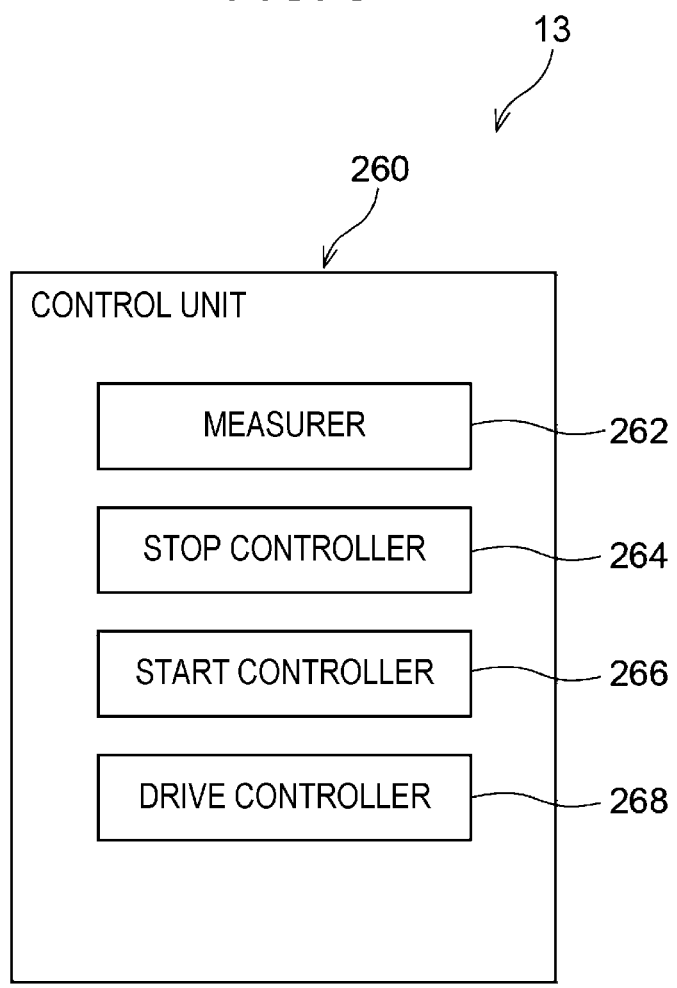
FIG. 8 is a block diagram illustrating an example of the functional configuration of a control unit of the sheet electrical resistance measuring device according to the third exemplary embodiment.

FIG. 8 illustrates an example of the functional configuration of the control unit 260. The control unit 260 includes a measurer 262, a stop controller 264, a start controller 266, and a drive controller 268. The measurer 262 measures the electrical resistance between the two electrodes 290 contacting the sheet P. The stop controller 264 instructs the drive controller 268 to stop driving the rotation drive mechanism 250 in response to input of a detection signal from the stop detection sensor 30. The start controller 266 instructs the drive controller 268 to start driving the rotation drive mechanism 250 in response to input of a detection signal from the start detection sensor 32. The drive controller 268 controls the rotation drive mechanism 250.

[Measuring Method for Electrical Resistance of Sheet]

A measuring method for the electrical resistance of the sheet P will now be discussed below.

As shown in FIG. 6A, in response to the start detection sensor 32 detecting the leading end PA of the sheet P inserted in the gap 14 at a position before the sheet pulling member 200, the control unit 260 causes the rotation drive mechanism 250 to start rotating the two rotating belt pairs 210 in the forward direction indicated by the arrow J, thereby pulling the sheet P into the far side of the housing 12.

When the sheet P is fed to a position at the back of the sheet pulling member 200 and the stop detection sensor 30 has detected the leading end PA of the sheet P passing through the sheet pulling member 200, the control unit 260 causes the rotation drive mechanism 250 to stop rotating the two rotating belt pairs 210. The position of the sheet P in this state is indicated by the imaginary lines (long dashed double-dotted lines) in FIG. 6A.

When the sheet P is stopped, the control unit 260 measures the electrical resistance of the sheet P contacting the two electrodes 290 between the two rotating belt pairs 210 (see FIG. 6B). In the third exemplary embodiment, the control unit 260 measures the surface resistance of the sheet P between the two electrodes 290. The measured electrical resistance of the sheet P is displayed on a display, which is not shown.

In the third exemplary embodiment, after the measurement result is displayed on the display, and then, after the lapse of a setting time, the control unit 260 causes the two rotating belt pairs 210 to rotate in the reverse direction indicated by the arrow G so as to feed back the sheet P toward the near (front) side.

[Operation]

The operation of the sheet electrical resistance measuring device 13 according to the third exemplary embodiment will be discussed below.

When the sheet P is inserted into the gap 14, the rotating belt pairs 210 of the sheet pulling member 200 start rotating to pull the sheet P into the far side, and when the stop detection sensor 30 detects the leading end PA of the sheet P, the sheet pulling member 200 automatically stops pulling the sheet P. When the sheet P is stopped, the two electrodes 290 measures the electrical resistance of the sheet P.

The sheet P is thus less likely to wrinkle compared with the configuration in which the sheet P is brought into contact with the electrodes 290 when it is inserted into the gap 14 of the housing 12.

In the sheet electrical resistance measuring device 13 of the third exemplary embodiment, in response to the start detection sensor 32 detecting the leading end PA of the sheet P inserted in the gap 14 at a position before the sheet pulling member 200, the rotating belt pairs 210 of the sheet pulling member 200 start rotating to pull the sheet P into the far side.

The sheet P is thus less likely to wrinkle compared with the configuration in which a user manually starts the sheet pulling member 200 pulling the sheet P into the far side.

In the sheet electrical resistance measuring device 13 of the third exemplary embodiment, the first and second belt units 220 and 240 of the rotating belt pairs 210 pull the sheet P by sandwiching both surfaces of the sheet P.

The sheet P is thus less likely to wrinkle compared with the configuration in which a rotator pulls the sheet P by contacting only one surface of the sheet P.

The first and second belt units 220 and 240 of the rotating belt pairs 210 sandwich both surfaces of the sheet P. The area of contact with the sheet P thus becomes larger than that when rotating rollers sandwich the sheet P. The occurrence of wrinkles in the sheet P is thus further reduced.

Since the occurrence of wrinkles in the sheet P is reduced in this manner, the measurement accuracy of the electrical resistance of the sheet P is less likely to be lowered.

If the stop detection sensor 30 detects a portion of the sheet P other than the leading end PA, such as the trailing end, the sheet P would be pulled farther into the rear side. In the third exemplary embodiment, the stop detection sensor 30 detects the leading end PA of the sheet P, thereby decreasing the pulling amount of the sheet P.

In one example, the stop detection sensor 30 detects the leading end PA of the sheet P at a position before the sheet pulling member 200, and then, after the lapse of a preset time, the rotating belt pairs 210 stop rotating. Unlike this configuration, in the third exemplary embodiment, the stop detection sensor 30 detects the leading end PA of the sheet P at the back of the sheet pulling member 200, thereby making it less likely to vary the stop positions of the sheet P.

Other Exemplary Embodiments

The disclosure is not limited to the above-described exemplary embodiments.

For example, in the first and second exemplary embodiments, both the first and second rotating rollers 120 and 130 are rotated. However, one of the first and second rotating rollers 120 and 130 may be a driven roller.

In the above-described exemplary embodiments, in response to the start detection sensor 32 detecting the leading end PA of the sheet P, the sheet pulling members 100 and 200 start driving. Alternatively, the sheet pulling members 100 and 200 may start driving when the sheet electrical resistance measuring devices 10, 11, and 13 are powered ON, or the user S may manually start driving the sheet pulling members 100 and 200.

In the first and third exemplary embodiments, the stop detection sensor 30 is disposed at the back of the sheet pulling member 100 or 200. Alternatively, the stop detection sensor 30 may be disposed at a position at which it overlaps the sheet pulling member 100 or 200 in the direction of the rotating shafts or at a position before the sheet pulling member 100 or 200. In this case, after the stop detection sensor 30 detects the leading end PA of the sheet P, the sheet pulling member 100 or 200 may stop pulling the sheet P after the lapse of a preset time or after the rotating roller pairs 110 or the rotating belt pairs 210 are rotated by a preset amount.

Although in the first and second exemplary embodiments the first rotating rollers 120, which serve as electrodes, are disposed in the direction of the rotating shaft 122, they may be arranged in the pulling direction F.

Although in the first and second exemplary embodiments the first rotating rollers 120 disposed in the first housing 20 are made conductive and used as electrodes, the second rotating rollers 130 disposed in the second housing 22 may be made conductive and used as electrodes. In this case, the first rotating rollers 120 may be formed as insulating rotating rollers.

Although in the first and second exemplary embodiments the first rotating rollers 120 serve as electrodes, two dedicated electrodes may be provided separately from the first rotating rollers 210. In this case, the first rotating rollers 120 may be formed as insulating rollers.

In the third exemplary embodiment, the electrodes 290 are disposed between the two rotating belt pairs 210 while being spaced apart in the direction of the rotating shafts 226 and 246. Alternatively, the electrodes 290 may be disposed to be spaced apart in the pulling direction F or may be displaced from the direction of the rotating shafts 226 and 246.

Although in the third exemplary embodiment the electrodes 290 are provided, the first belt unit 220 or the second belt unit 240 may serve as electrodes. More specifically, the first rotating belt 222 and one of the rollers 224 may be made conductive and used as electrodes, or the second rotating belt 242 and one of the rollers 244 may be made conductive and used as electrodes.

Although the surface resistance of the sheet P is measured in the above-described exemplary embodiments, the volume resistance may alternatively be measured. If the volume resistance is measured, both surfaces of the sheet P are brought into contact with the electrodes.

Some components of the above-described exemplary embodiments may be combined. For example, the first rotating rollers 120 of the first exemplary embodiment may be provided in the first housing 20, while the second belt units 240 of the third exemplary embodiment may be provided in the second housing 22. With such a sheet pulling member, the area of contact with the sheet P can be increased using fewer components.

In the above-described exemplary embodiments, a pair of rotators pulls a sheet by sandwiching both surfaces of the sheet. Alternatively, a rotator may pull a sheet by contacting only one surface of the sheet. More specifically, a rotator may be disposed in only one of the first and second housings 20 and 22. Additionally, a mechanism other than a rotator may be used. For example, a member, which contacts one or both surfaces of a sheet, may pull a sheet by sliding in the pulling direction.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A sheet electrical resistance measuring device comprising:
    a housing having a gap for receiving a sheet therein;
    a sheet pulling member that is disposed in the housing and pulls the sheet inserted into the gap;
    a stopper that is disposed in the housing and causes the sheet pulling member to stop pulling the sheet; and
    a pair of electrodes that is disposed in the housing and measures electrical resistance of the sheet which is stopped and brought into contact with the pair of electrodes,
    wherein the housing includes a first housing, a second housing, a joint section which connects end portions of the first housing and the second housing, and a sensor, apart from the pair of electrodes, is disposed on either the first housing or the second housing to detect a leading end of the sheet and to cause the sheet pulling member to stop pulling the sheet in response to having detected the leading end of the sheet so as to prevent the sheet from contacting the joint section, and
    wherein the gap is formed between the first housing, the second housing and the joint section so that the sheet is inserted into the gap in a flat manner along a pulling direction of the sheet pulling member.

2. The sheet electrical resistance measuring device according to claim 1, further comprising:
    a starter that is disposed in the housing and that causes the sheet pulling member to start pulling the sheet in response to the sensor having detected the sheet inserted into the gap.

3. The sheet electrical resistance measuring device according to claim 1, wherein the stopper causes the sheet pulling member to stop pulling the sheet, based on a result of the sensor detecting a leading end of the sheet inserted into the gap.

4. The sheet electrical resistance measuring device according to claim 2, wherein the stopper causes the sheet pulling member to stop pulling the sheet, based on a result of the sensor detecting a leading end of the sheet inserted into the gap.

5. The sheet electrical resistance measuring device according to claim 3, wherein the stopper causes the sheet pulling member to stop pulling the sheet in response to the sensor detecting that the leading end of the sheet is fed from the sheet pulling member to a rear side of the housing.

6. The sheet electrical resistance measuring device according to claim 4, wherein the stopper causes the sheet pulling member to stop pulling the sheet in response to the sensor detecting that the leading end of the sheet is fed from the sheet pulling member to a rear side of the housing.

7. The sheet electrical resistance measuring device according to claim 1, wherein the sheet pulling member includes a pair of rotators that sandwiches both surfaces of the sheet.

8. The sheet electrical resistance measuring device according to claim 2, wherein the sheet pulling member includes a pair of rotators that sandwiches both surfaces of the sheet.

9. The sheet electrical resistance measuring device according to claim 3, wherein the sheet pulling member includes a pair of rotators that sandwiches both surfaces of the sheet.

10. The sheet electrical resistance measuring device according to claim 4, wherein the sheet pulling member includes a pair of rotators that sandwiches both surfaces of the sheet.

11. The sheet electrical resistance measuring device according to claim 5, wherein the sheet pulling member includes a pair of rotators that sandwiches both surfaces of the sheet.

12. The sheet electrical resistance measuring device according to claim 6, wherein the sheet pulling member includes a pair of rotators that sandwiches both surfaces of the sheet.

13. The sheet electrical resistance measuring device according to claim 1, wherein:
    the sheet pulling member includes a pair of rotators that sandwiches both surfaces of the sheet; and
    the stopper causes the pair of rotators to stop rotating, based on a result of detecting a rotation load of the pair of rotators.

14. The sheet electrical resistance measuring device according to claim 2, wherein:
    the sheet pulling member includes a pair of rotators that sandwiches both surfaces of the sheet; and
    the stopper causes the pair of rotators to stop rotating, based on a result of detecting a rotation load of the pair of rotators.

15. The sheet electrical resistance measuring device according to claim 7, wherein:
    a rotator forming the pair of rotators and a rotator forming the pair of rotators are disposed to be spaced apart in a direction of rotating shafts of the rotators or in the pulling direction of the sheet pulling member; and
    the rotators spaced apart from each other also serve as the pair of electrodes.

16. The sheet electrical resistance measuring device according to claim 8, wherein:
    a rotator forming the pair of rotators and a rotator forming the pair of rotators are disposed to be spaced apart in a direction of rotating shafts of the rotators or in the pulling direction of the sheet pulling member; and
    the rotators spaced apart from each other also serve as the pair of electrodes.

17. The sheet electrical resistance measuring device according to claim 9, wherein:
    a rotator forming the pair of rotators and a rotator forming the pair of rotators are disposed to be spaced apart in a direction of rotating shafts of the rotators or in the pulling direction of the sheet pulling member; and
    the rotators spaced apart from each other also serve as the pair of electrodes.

18. The sheet electrical resistance measuring device according to claim 7, wherein the rotators are rotating rollers.

19. The sheet electrical resistance measuring device according to claim 7, wherein the rotators are rotating belts stretched on a plurality of rollers.

20. The sheet electrical resistance measuring device according to claim 7, wherein one rotator forming the pair of rotators is a rotating roller, and the other rotator forming the pair of rotators is a rotating belt stretched on a plurality of rollers.

* * * * *